(12) United States Patent
Weisgerber et al.

(10) Patent No.: US 7,181,058 B2
(45) Date of Patent: Feb. 20, 2007

(54) METHOD AND SYSTEM FOR INSPECTING ELECTRONIC COMPONENTS MOUNTED ON PRINTED CIRCUIT BOARDS

(75) Inventors: John J. Weisgerber, Whitmore Lake, MI (US); Donald J. Svetkoff, Ann Arbor, MI (US); Donald K. Rohrer, Whitmore Lake, MI (US)

(73) Assignee: GSI Group, Inc., New Brunswick (CA)

( * ) Notice: Subject to any disclaimer, the term of this patent is extended or adjusted under 35 U.S.C. 154(b) by 204 days.

(21) Appl. No.: 09/735,097

(22) Filed: Dec. 11, 2000

(65) Prior Publication Data
US 2003/0016859 A1    Jan. 23, 2003

Related U.S. Application Data

(60) Provisional application No. 60/170,462, filed on Dec. 13, 1999.

(51) Int. Cl.
*G06K 9/00* (2006.01)
(52) U.S. Cl. .................. 382/145; 382/147; 382/151; 250/559.34; 348/126
(58) Field of Classification Search ................ 382/141, 382/145–147, 150, 151, 154; 356/237.5, 356/237.1, 237.2, 398, 394, 237.4; 348/87, 348/94, 125, 126; 29/833; 438/16, 18; 250/559.34, 250/559.36, 559.4
See application file for complete search history.

(56) References Cited

U.S. PATENT DOCUMENTS 4,159,648 A * 7/1979 Prosky ...................... 374/170
5,956,134 A    9/1999 Roy et al.
6,047,084 A * 4/2000 Kent et al. .................. 382/147
6,522,777 B1 * 2/2003 Paulsen et al. ............. 382/154
6,526,165 B1 * 2/2003 Montillo et al. ............ 382/145

FOREIGN PATENT DOCUMENTS

WO    WO 99/00661    1/1999

OTHER PUBLICATIONS

Donald J. Svetkoff et al. "Automatic Inspection of Component Boards using 3D and Greyscale Vision", Proceedings of ISHM, pp. 58-64, Nov. 1986.*

(Continued)

*Primary Examiner*—Samir Ahmed
(74) *Attorney, Agent, or Firm*—Brooks Kushman P.C.

(57) ABSTRACT

A method and system are provided for inspecting electronic components mounted on printed circuit boards utilizing both 3-D and 2-D data associated with the components and the background on which they are mounted on the printed circuit board. Preferably, a 3-D scanner in the form of a solid state dual detector laser images the components and solder paste on the printed circuit board to obtain the 3-D and 2-D data. Then, a high speed image processor processes the 3-D data to find the locations of the leads and the solder paste. Then, the high speed image processor processes the 2-D data together with the locations of the leads and the solder paste to distinguish the leads from the solder paste. The high speed image processor may calculate centroids of feet of the leads, average height of the feet and border violation percentage of the solder paste.

23 Claims, 9 Drawing Sheets

OTHER PUBLICATIONS

P. Mengel, Automated Inspection of Solder Joints On PC Boards By Supplementary Processing of 3D And Gray-Level Images, IEEE Industrial Electronics Society, vol. I, Nov. 27, 1990.

P. Mengel, Flachbaugruppen Optisch Und Physikalisch Prufen, Feinwerktechnik & Messtechnik, No. 12, Dec. 1990.

Svetkoff, Donald, et al., Automated Inspection of Component Boards Using 3D and Greyscale Vision, Nov. 1986, Proceedings of ISHM.

Svetkoff, Donald, et al., A High Speed, 3-D Imager For Inspection and Measurement of Minature Industrial Parts, 1989, SME Conference on Machine Vision.

Juha, Michael, et al., The Use of 3-D Imaging For The Inspection of Hybrid/SMT Circuits, Nov. 1986, Proceedings of ISHM.

* cited by examiner

METHOD AND SYSTEM FOR INSPECTING ELECTRONIC COMPONENTS MOUNTED ON PRINTED CIRCUIT BOARDS

CROSS-REFERENCE TO RELATED APPLICATION

This application claims the benefit of U.S. provisional patent application Ser. No. 60/170,462, filed Dec. 13, 1999.

TECHNICAL FIELD

This invention relates to methods and systems for inspecting electronic components mounted on printed circuit boards, and is primarily intended for use at an inspection station placed in a surface mount PCB production line.

BACKGROUND ART

The most typical method for inspection of components including leads is with 1 2-D or intensity-only sensor, i.e., a camera of some sort. These methods cannot directly provide lead coplanarity information. These methods are subject to false-calls and poor performance (accuracy, repeatability, and robustness) due to chaos in the intensity information coming from the component leads, the solder paste deposits, and the PCB.

Component placement inspection before reflow is necessary to minimize defects in the SMT process. Rework cost at this point is lower than after reflow, since components can be repositioned, added, or replaced without the need to de-solder or re-solder the components.

Utilizing 3-D inspection allows for real-time process control feedback of the placement operation. 3-D inspection can be used to assess stability and capability of the placement systems.

Inspection can also be done after reflow, but this is the most difficult point to rework and correlate. Typical rework costs are highest at this point. The reflow process time between component placement and after reflow is on the order of 10–15 minutes and does not allow for real-time corrective action and process control. Recurrent problems with placement equipment are not caught early enough to prevent production of multiple bad boards.

Typical Component Defects

The table below lists some component placement problems. Not all the end defects are attributed to the placement process alone, but eliminating as many of these problems early on will improve yield.

| | |
|---|---|
| Missing Components | Non-functioning board |
| Misplaced Components | Open or short connection |
| | Poor electrical connection |
| | Poor reliability |
| | Non-functioning board |
| Wrong Polarity | Non-functioning board |
| Poor Lead Coplanarity | Opens |
| | Poor electrical connection |
| | Poor reliability |
| Wrong Component | Non-functioning board |

To be effective, an inspection system should be able to locate as many of the above defects as possible.

Methods of Inspection

2-D systems are camera-based systems which are possibly capable of measuring component alignment and polarity but are sensitive to color and contrast changes, e.g., the color and location of the solder mask, pads and component. They may require constant lighting or algorithm adjustments. 2-D systems do not provide height information which is necessary for coplanarity. Color cameras are sometimes used to enhance detection of components.

3-D systems are capable of providing height information. True XY, theta and coplanarity information can be acquired from height data points. 3-D has the added benefit of being insensitive to color and contrast changes.

X-ray inspection can be used at the end of the line to find solder joint and placement defects. However, this is at the last stages of the SMT process and thus the least cost effective.

A combination of 2-D and 3-D data takes full advantage of the benefits of both types of inspection.

Some notion of utilizing 3-D data to perform component inspection has been presented in the following papers:

Svetkoff et al., "Automated Inspection of Component Boards Using 3D and Greyscale Vision", November 1986, PROCEEDINGS OF ISHM, which describes some methods for combining 2-D and 3-D data, and draws the conclusion that a combination of 2-D and 3-D data offers a more robust solution than either 2-D or 3-D data alone;

Svetkoff et al., "A High Speed, 3-D Imager for Inspection and Measurement of Miniature Industrial Parts", 1989, SME CONFERENCE ON MACHINE VISION, which describes the type of sensor employed by the best mode of the method and system of the present invention. This paper discloses SMT component inspection as a likely application of such a sensor; and Juha et al., "The Use of 3-D Imaging for the Inspection of Hybrid/SMT Circuits", November 1986, PROCEEDINGS OF ISHM, which describes inspection of SMT components using a sensor similar to the one employed by the best mode of the method and system of the present invention. This paper discussed strengths of 3-D data acquired at high data rates, but draws no conclusions regarding the combination of 2-D and 3-D data. The system described in this paper was never implemented.

DISCLOSURE OF INVENTION

A general object of the invention is to provide a method and system for inspecting electronic components mounted on printed circuit boards wherein measurements obtained can be used to judge the probable quality of the solder joint which will be formed at the component leads, endcaps, or other metallic interconnects—that is, the quality of the mechanical and electrical connections formed when the solder paste is reflowed.

A specific object of the invention is to provide a method and system for inspecting electronic components mounted on printed circuit boards including means to perform measurement of the location (X, Y, Z and theta) of components in solder paste prior to reflow.

A specific object of the invention is to (substantially simultaneously with lead location) provide a method and system for inspecting electronic components mounted on printed circuit boards to detect bridging between solder paste deposits placed on individual PCB lands.

In carrying out aspects of one embodiment of the present invention, a method is provided for inspecting electronic components mounted on a printed circuit board with a mounting substance. Each of the components includes endcaps (i.e., a metallic interconnect typical of surface mount chip capacitors and resistors). The method includes the steps of imaging the components and the surrounding material to obtain 3-D and 2-D data. The method also includes the steps of processing the 2-D and 3-D data to find the locations of the endcaps and further processing with the 2-D data to isolate the component endcaps from the component body.

Further in carrying out aspects of one embodiment of the present invention, a method is provided for inspecting electronic components mounted on a printed circuit board with a mounting substance. Each of the components includes leads. The method includes the steps of imaging the components and the mounting substance to obtain 3-D and 2-D data associated with the leads and the mounting substance. The method also includes the step of processing the 3-D data to find the locations of the leads and the mounting substance and processing the 2-D data together with the locations of the leads and the mounting substance to distinguish the leads from the mounting substance.

The mounting substance may be solder paste or an adhesive such as glue.

The method may also include the steps of calculating centroids of feet of the leads, calculating average height of the feet and/or calculating border violation percentage of the mounting substance.

Further in carrying out the above objects and other objects of the present invention, a system is provided for inspecting electronic components mounted on a printed circuit board with a mounting substance. Each of the components includes leads. The system includes a 3-D scanner for 3-D imaging the components and the mounting substance on the printed circuit board to obtain 3-D and 2-D data associated with the leads and the mounting substance. The system also includes a high-speed image processor for processing the 3-D data to find the locations of the leads and the mounting substance and processing the 2-D data together with the locations of the leads and the mounting substance to distinguish the leads from the mounting substance.

The mounting substance may be solder paste or an adhesive such as glue.

The high-speed image processor may calculate centroids of feet of the leads, calculate average height of the feet and/or calculate border violation percentage of the mounting substance.

The above objects and other objects, features, and advantages of the present invention are readily apparent from the following detailed description of the best mode for carrying out the invention when taken in connection with the accompanying drawings.

BRIEF DESCRIPTION OF DRAWINGS

FIG. 4b is a side view, partially broken away and in cross-section, of the component of FIG. 4a;

FIG. 5b is a side view of the glue dot of FIG. 5a;

FIG. 7b is a top view, partially broken away and in cross-section, of the part and a number of leads of FIG. 7a;

FIG. 10b is a side view, partially broken away and in cross-section, of the component of FIG. 10a;

BEST MODE FOR CARRYING OUT THE INVENTION

Lead Foot Algorithm

In one embodiment of the present invention, the foot of the lead is located. The method and system of the present invention rely on the fact that component leads which are difficult to identify using 2-D or 3-D data alone can be more easily identified with a combination of both 2-D and 3-D data. The following table illustrates this concept clearly:

| Visible Elements | 2-D Category | 3-D Category |
| --- | --- | --- |
| Body | Dark | High |
| Knee | Bright | Medium High |
| Foot | Bright | Medium Low |
| Paste | Dark | Medium Low |
| Board | Dark | Low |
| Trace | Bright | Low |

Note that the lead (i.e., foot) cannot be uniquely identified with either the 2-D or 3-D data as categorized above, but there is a unique identity given by bright 2-D data and medium low 3-D data.

Figure 1:
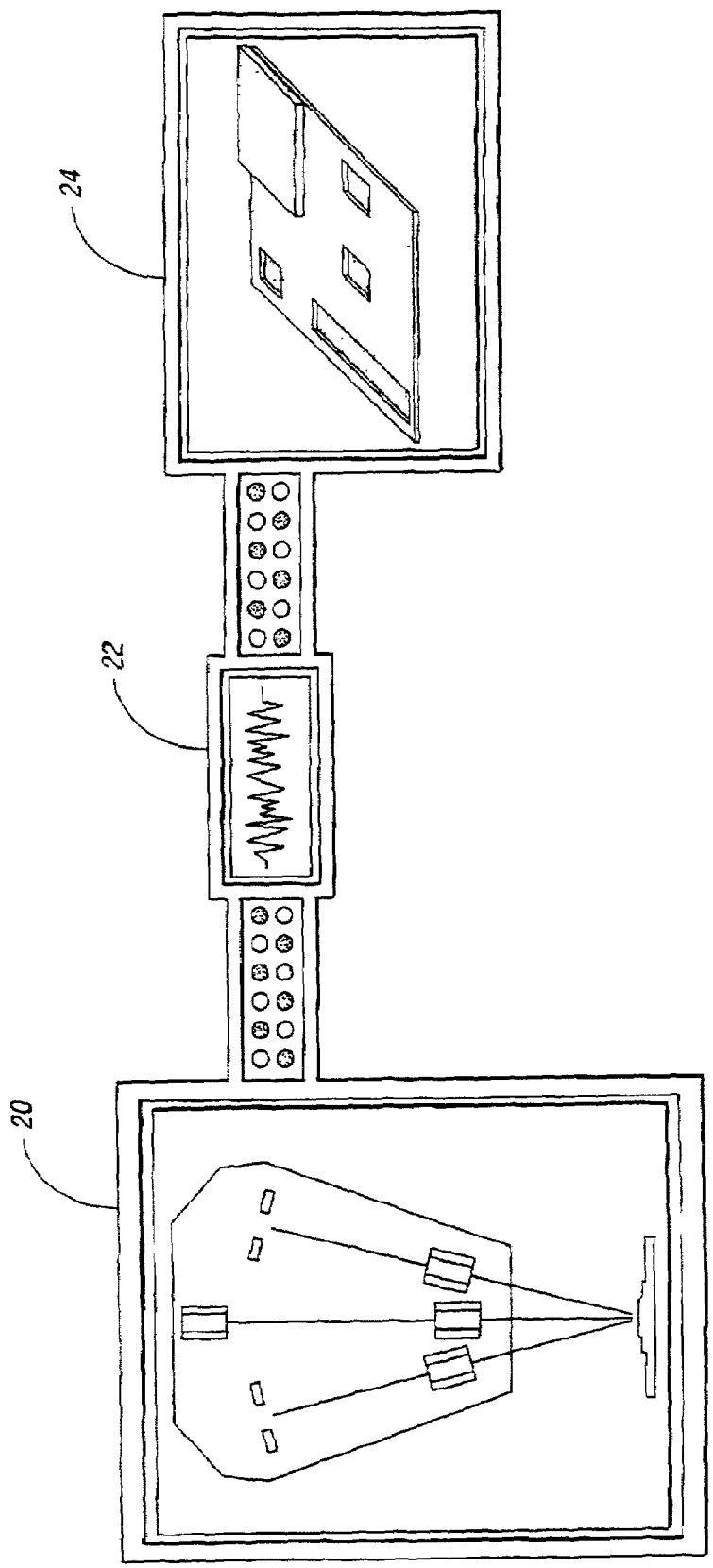
FIG. 1 is a schematic diagram of a system for inspecting electronic components having leads and solder paste in accordance with the present invention.

Data acquisition for the best mode is accomplished via an inspection system utilizing 3-D laser scanning technology, as illustrated in FIG. 1. At block 20, a solid state dual detector laser acquires data at millions of data points per second.

At block 22, high-speed image processing hardware and software processes both 3-D and 2-D data.

At block 24, critical process information is collected for real-time SPC and compared against user-defined measurement criteria. Report charts and graphs and image data can be displayed on-screen.

Figure 2:
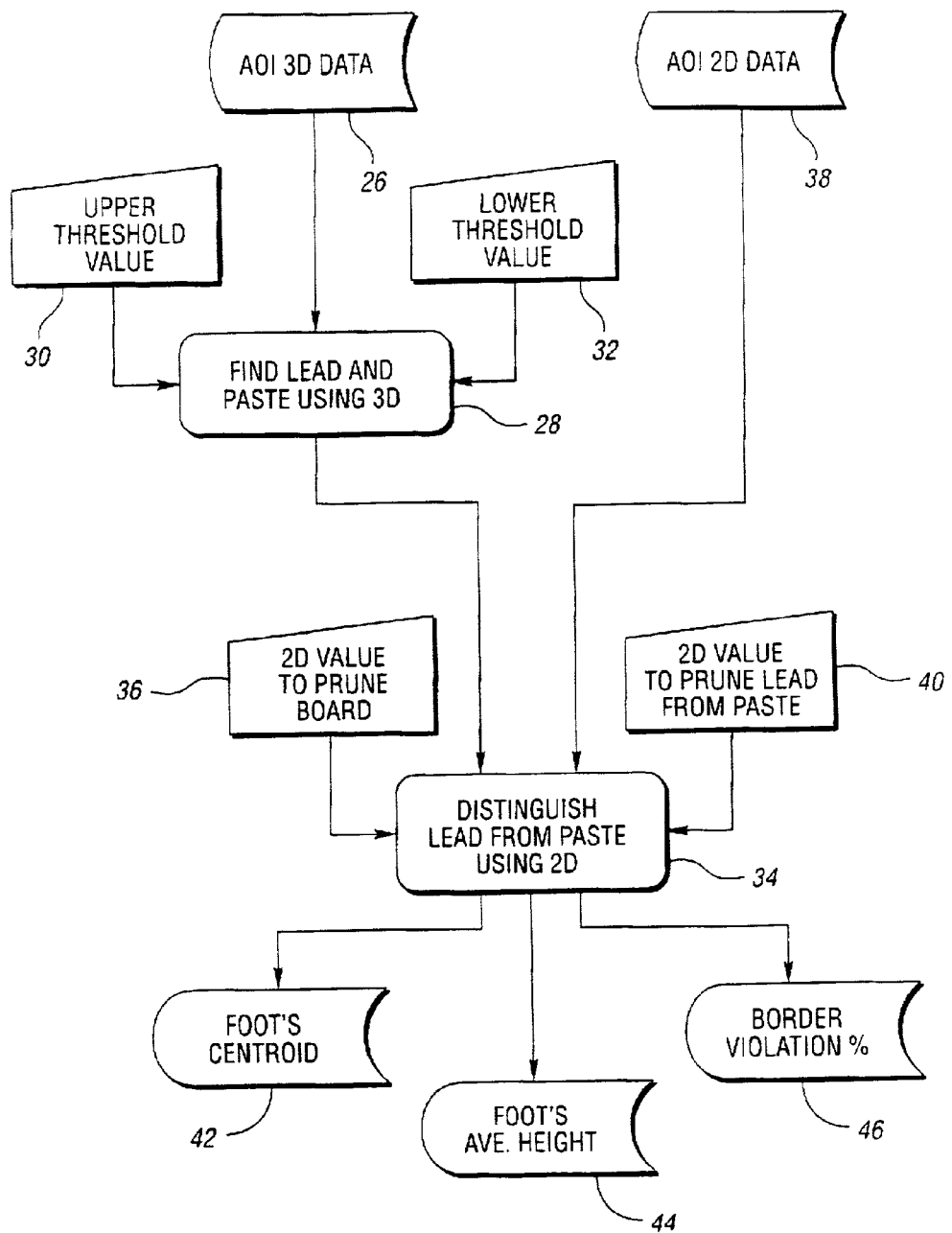
FIG. 2 is a generalized block diagram flow chart illustrating various process steps of the method of the invention for lead location.

A conceptual flow chart for this embodiment of the present invention is disclosed in FIG. 2.

At block 26, 3-D data is acquired in an area of interest (AOI).

At block 28, component lead and solder paste are found using the 3-D data utilizing an upper threshold value of block 30 and a lower threshold value of block 32.

At block 34, after the component lead and solder paste are found at block 28, the component lead is distinguished from the solder paste using 2-D information acquired at block 38, a 2-D value to prune the board at block 36 and a 2-D value to prune the lead from the paste at block 40.

After the component lead is distinguished from the solder paste at block 34, the foot centroid is computed and stored at block 42, the foot's average height is computed and stored at block 44, and a border violation percent figure is calculated and stored at block 46.

Detailed Description of Method

Terms:

AOI—Area of Interest. Any inspection box or feature.

Blob Image—A two-dimensional pixel array used as a mask for 2-D and 3-D image data. Pixels that touch or are related are coded with like values. Generally formed via thresholding techniques and application of a connected component algorithm.

Edge Image—A two-dimensional pixel array containing only pixels at the outside edges of the blobs in the corresponding blob image. Produced as a by-product of a connected component algorithm. Useful for finding/measuring shapes.

Threshold Image—A two-dimensional pixel array containing a set of coded values based on one or more thresholds being applied to image data. The threshold image is often binary (1's, 0's) though it may be coded with values to apply weighting factors to the pixels which may be used during algorithmic processing of image data.

2-D and 3-D Data—Generally refers to data collected with a commercially available 3-D scanner. In a preferred embodiment of the present invention, each pixel of data produced by the scanner 20 has both a 3-D (height) and a 2-D (intensity) pixel which are perfectly spatially synchronized. In some cases, both 2-D and 3-D information are utilized for algorithm processing.

Prune—A term used to describe masking, or otherwise coding pixels in an AOI or image for the purpose of eliminating them from consideration. Applied to pixels which fall within some classification. Usually those pixels above or below a threshold.

Foot (Lead and Paste Locator) Algorithm

Figure 3:
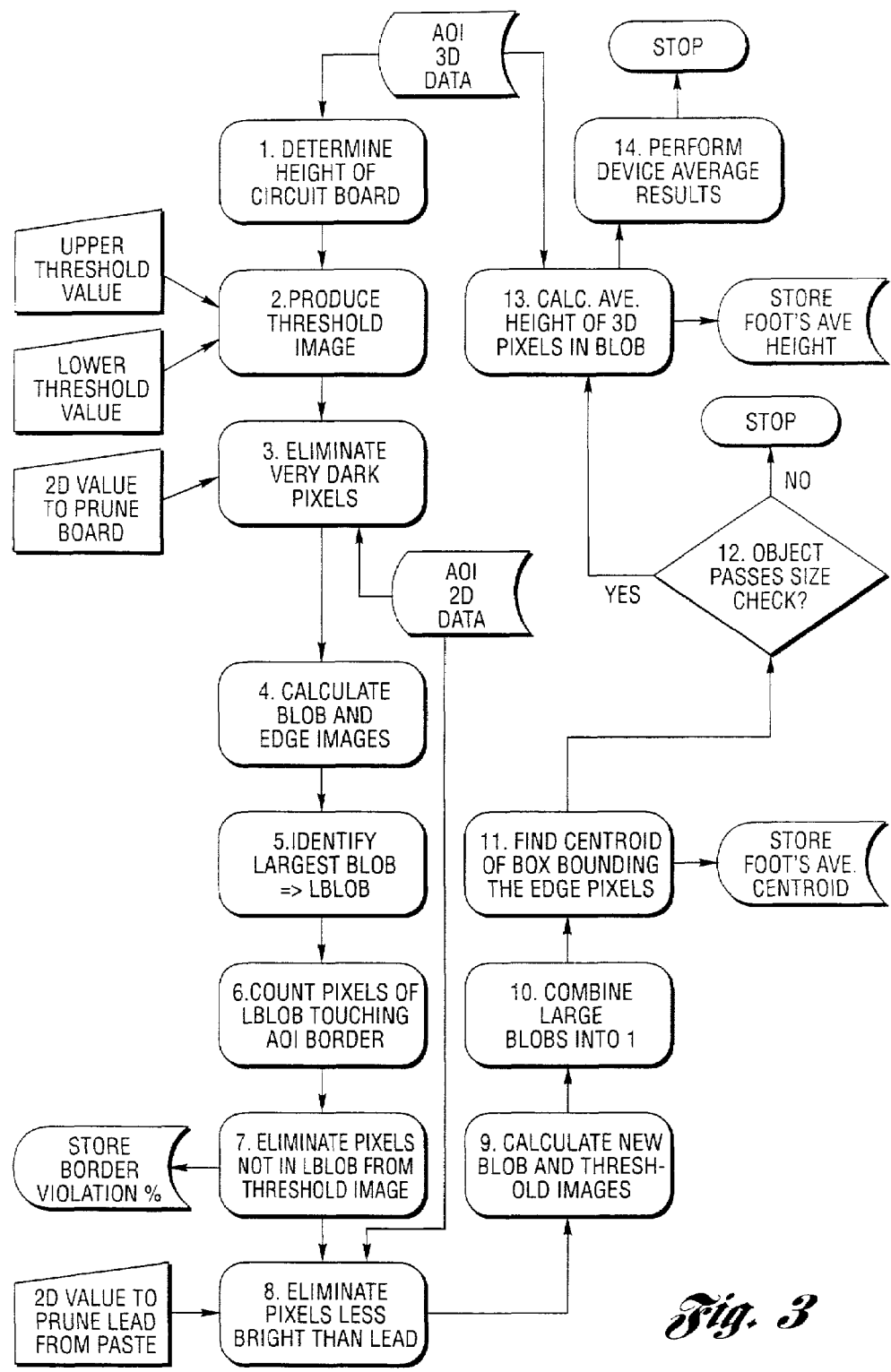
FIG. 3 is a detailed block diagram flow chart illustrating the various process steps of the method of the invention for lead location.

The method of FIG. 3 is used to find the foot of a lead within an AOI. This method is intended primarily for use in inspection after component placement, but before solder reflow.

The method can return the X and Y location of the lead's foot (i.e., block 42 of FIG. 2), the average height of the foot above the first layer traces on the PCB (i.e., block 44 of FIG. 2), and a measure of the amount of solder-paste contacting the AOI's border (i.e., block 46 of FIG. 2) (border-violation used to detect possible bridging).

The detailed method proceeds as follows with respect to FIG. 3:

1. Determine the height of the circuit board at the AOI using one or more reference boxes placed over first layer trace and using 3-D data (i.e., block 1 of FIG. 3).
2. Produce a threshold image based on the height from step 1 and two (height-based) threshold levels. One level to prune out the PCB (lower threshold), and one to prune out the lead's knee and the component body (upper threshold) (block 2 of FIG. 3).
3. Modify the threshold image by pruning out pixels which have a 2-D value under a predetermined value. The circuit board is darker than the paste or lead, so this can eliminate pixels which are in the threshold image due to erroneous 3-D data points.
4. Calculate a blob image and an edge image from the modified threshold image from step 5 (i.e., block 4 in FIG. 3).
5. Identify the largest blob in the blob image returned by step 7. A connected component algorithm returns a list of blob sizes and indicates how the blobs are coded in the blob image (i.e., block 5 in FIG. 3).
6. Calculate the number of pixels in the blob from step 8 which contact the AOI's border. This is stored as a percent of the perimeter of the AOI, and can be used to indicate the potential for bridging (i.e., block 6 in FIG. 3).
7. Turn off any pixels in the threshold image which are not contained in the blob from step 8 (i.e., block 7 in FIG. 3).
8. Modify the threshold image by pruning out pixels which have a 2-D value under a predetermined value. This step is intended to eliminate the paste (which is darker in intensity than the lead) from consideration by the remainder of the algorithm. This leaves only pixels within the proper height and intensity to be considered part of the lead foot (a relatively small number of pixels) (block 8 in FIG. 3).
9. Calculate a blob image and an edge image from the modified threshold image from step 11 (i.e., block 9 in FIG. 3).
10. Any relatively large blobs from step 12 are combined into a single coding in the blob and edge images. This is because connectivity cannot be assumed within the 2-D data (i.e., block 10 of FIG. 3).
11. Find the centroid of the box most closely bounding the pixels of the edge image (block 11 of FIG. 3). This is not limited to the orthogonal bounding box—a "convex-hull" type algorithm is employed through a narrow set of angles for this purpose. The centroid is used to report the X and Y location of the lead foot within the image.
12. Check to see if the size of the bounding box identified in step 14 qualifies the feature (lead foot) as found. The size is checked against a predefined expected area for the feature (block 12 of FIG. 3).
13. Use the blob pixels coded in step 13 as a mask of the corresponding pixels in the original 3-D image data. Those pixels are averaged to provide an average height of the lead foot's surface above the plane of the first layer trace (block 13 of FIG. 3).
14. Results from multiple AOIs (for instance all the leads of a QFP) processed by the preceding steps are combined with fiducial location information to provide overall device measurements including X/Y shift, overall angle of rotation, and coplanarity of the leads (block 14 of FIG. 3).

Component Endcap Algorithm

The definitions and terms of the previous section will also describe the corresponding terms in this section.

In one embodiment of the present invention the endcaps of a component are located. The method and system of the present invention rely on the fact that components which are difficult to identify using 2-D or 3-D data alone can be more easily identified with a combination of both 2-D and 3-D data to locate the endcaps. The following table illustrates this concept clearly:

| Visible Elements | 2-D Category | 3-D Category |
|---|---|---|
| Body | Dark | High |
| Endcap | Bright | High |
| Paste | Dark | Medium Low |
| Board | Dark | Low |
| Trace | Bright | Low |

Note that the endcaps cannot be uniquely identified with either the 2-D or 3-D data as categorized above, but there is a unique identity given by bright 2-D data and high 3-D data.

Data acquisition for the best mode is accomplished via an inspection system utilizing 3-D laser scanning technology, as illustrated in FIG. 1. At block 20, a solid state dual detector laser acquires data at millions of data points per second.

At block 22, high-speed image processing hardware and software processes both 3-D and 2-D data.

At block 24, critical process information is collected for real-time SPC and compared against user-defined measurement criteria. Report charts and graphs and image data can be displayed on-screen.

Figure 11:
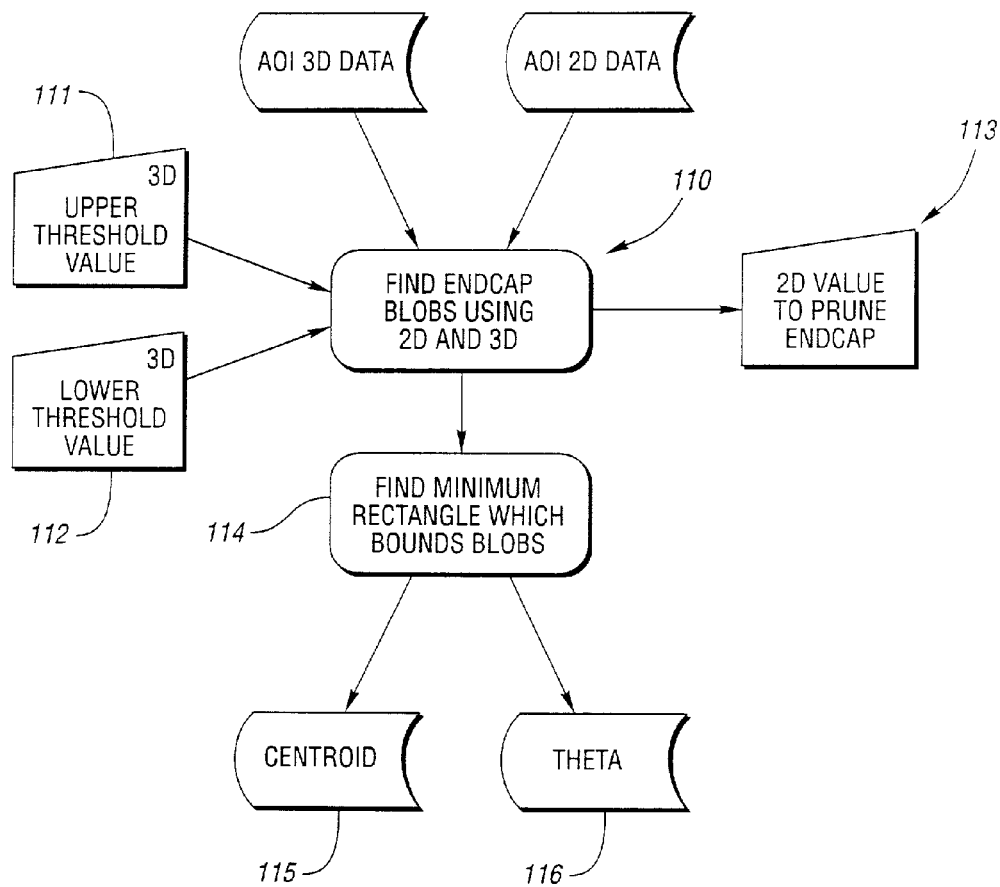
FIG. 11 is a block diagram flow chart illustrating various process steps of the method of the invention for one embodiment used for endcap location.

A conceptual flow chart for this embodiment of the present invention is disclosed in FIG. 11.

At block 110, 3-D and 2-D data is acquired in an area of interest (AOI). Component endcaps are found using the 3-D data utilizing an upper 3D threshold value of block 111 and a lower threshold value of block 112, and a 2D threshold value of block 113.

After the component endcaps are located at block 110, the rectangle which most closely bounds the component is calculated at block 114. The centroid for the component is stored at block 115 and the theta for the component is stored at block 116.

Endcap Algorithm Description

The method is used to find the location of a component with visible endcaps within an AOI. The relatively bright endcaps are recognized to provide a more reliable source of image data than the relatively dark component body.

The method can return the X and Y location of the component as well as a Theta value representing the amount of rotation relative to the expected orientation of the component.

Figure 12:
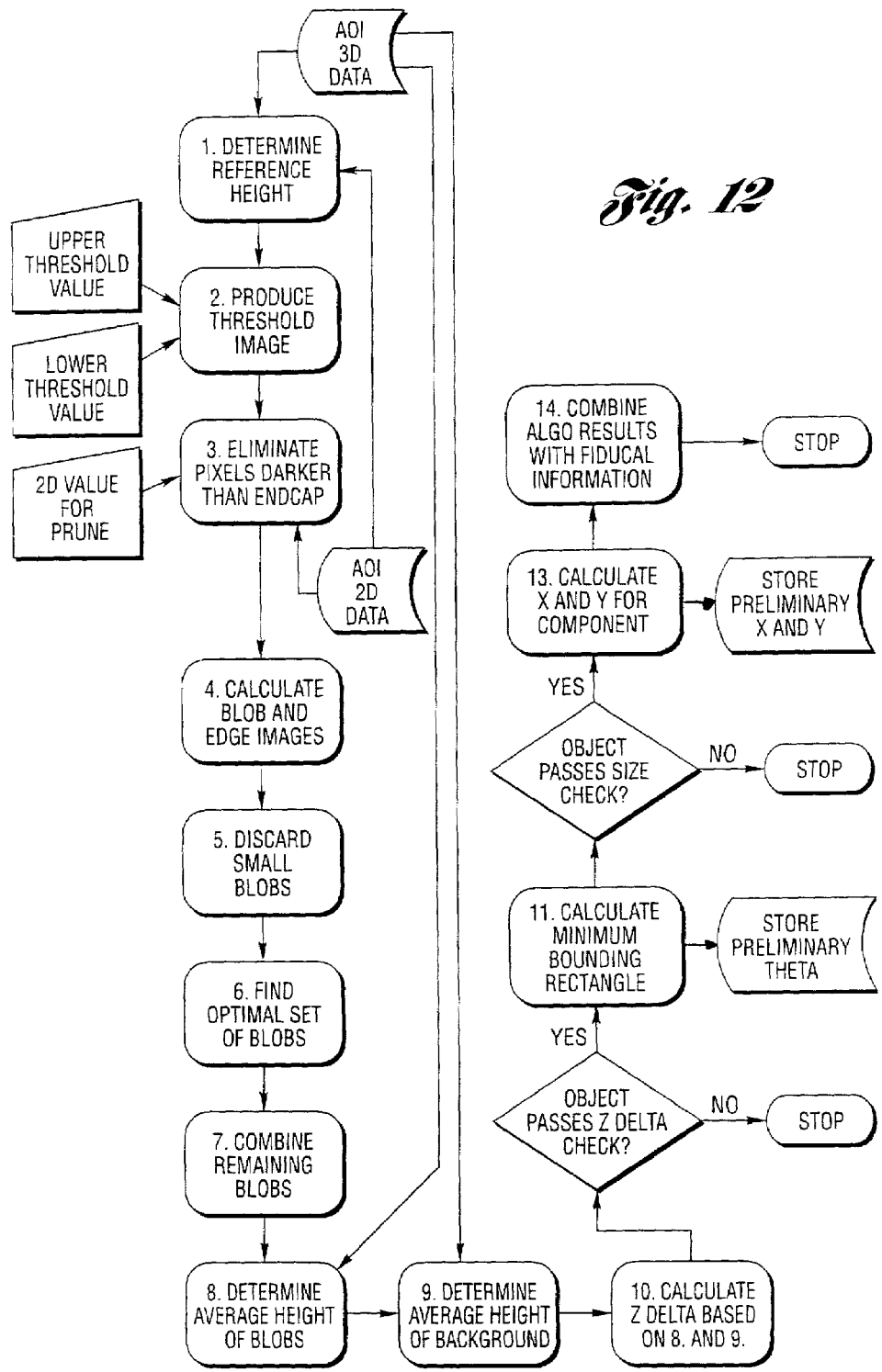
FIG. 12 is a detailed block diagram flow chart illustrating the various process steps of the method of the invention for one embodiment used for endcap location.

The following steps correspond to the detailed flowchart show in FIG. 12.

1. Determine a reference height for the AOI. The reference height may be the height of the top surface of the component's endcaps or the height of the background data surrounding the component. In either case the height of the reference is obtained by performing a histogram analysis of the 3D data within the AOI. When referencing to the top surface of the component's endcaps, a predetermined 2D threshold value is used to differentiate between the endcaps and the remainder of the component body.
2. Produce a threshold image based on the height determined from step 1 and two height based threshold levels. One level to prune out the PCB, and one to prune any other taller components which may be in the AOI.
3. Modify the threshold image by pruning out pixels which have a 2-D value under a predetermined value. This is to isolate the endcaps from the remainder of the component body, and can also eliminate false height pixels in the AOI data which may be present due to scene variations.
4. Calculate a blob image and an edge image from the modified threshold image from step 3.
5. Discard from consideration any small blobs from the blob image and edge image. The discarded blobs are those which are less than a predetermined percentage of the area of the largest single blob found in the AOI. The remaining blobs could also include the endcaps of nearby components with similar 2D and 3D characteristics. The components can be placed in very close proximity to each other either by design or accidentally due to a placement error.
6. If the size of the component to be located is small enough to avoid heavy processing overhead, perform an algorithm which determines the set of blobs which most optimally match the size and shape of the component. The method for determining this is to look at all possible combinations of blobs remaining after step 5. The rectangular region which bounds the set of blobs is discovered. This is similar to a simple "convex hull" operation. The rectangular region which most closely matches the size and shape of the component to be located is selected, and a list of all blobs contained within that region are returned. All blobs which are not contained within the list are discarded from consideration.
7. The blobs remaining after step 6 are combined into a single coding in the blob and edge images. The remaining blobs should represent the shapes of the endcaps within the AOI.
8. Use the blob pixels coded in step 7 as a mask of the original 3D pixel data and find the average height of the component endcaps by averaging the height data of pixels contained in the mask.
9. Determine an average height for the background within the AOI. This can be done via histogram analysis method, and can take the previously produced blob/edge images into consideration.
10. Calculate the "z delta" as the difference in the heights calculated from steps 8 and 9. The z delta is compared to a predetermined "minimum z delta" parameter for the component. This parameter can be trained/learned during algorithm setup, can be taken from a database of information on component packages, or can be supplied numerically. If the z delta is below the minimum z delta, then fail the component as missing. This avoids a false accept which can occur if the component is missing entirely from the AOI. This false accept would occur because bare pads or solder deposits on the board are mis-identified as the component's endcaps.
11. Using a simple "convex-hull" type algorithm, determine the rectangle which most closely bounds the set of blobs coded together in step 7. The method for doing this is to rotate the pixels through a set of angles at some interval. After each rotation, determine the area of the rectangle placed orthogonally around the pixels. Record the angle at which the smallest area occurs. The smallest area indicates the rectangle most closely bounding the blobs. Record the angle of rotation, and the X/Y coordinates of the vertices of the minimum bounding rectangle.
12. Perform a "size check" on the discovered component. If the area of the minimum bounding rectangle discovered in step 11 varies from the area expected for the component, then fail the component as missing. This check can discover cases when the wrong component is placed, or when the component is placed on edge or on end.

13. Calculate an X and Y location for the component. This can be calculated from the vertices of the rectangle discovered in step 11, or can be calculated as the centroid of the pixels from the combined blob image from step 7.

14. The X, Y, and Theta information calculated from this AOI are combined with fiducial location information to report final values. These final values can be compared against tolerance limits to judge the component placement as good or bad.

The method of the present invention (endcap and foot detection algorithms) includes a number of algorithms as follows: corner, clear, knee, foot, polarity, simple, endcap, and side. The following is a description of the parameters used for these algorithms of the invention with reference to FIGS. 4a through 10b.

Corner Algorithm Description

In general, this algorithm is used for large square objects which will not fit in a single image. The algorithm can be used on objects which fit within an image instead of the simple algorithm for efficiency, but will probably have worse repeatability than the simple algorithm.

Figure 4A:
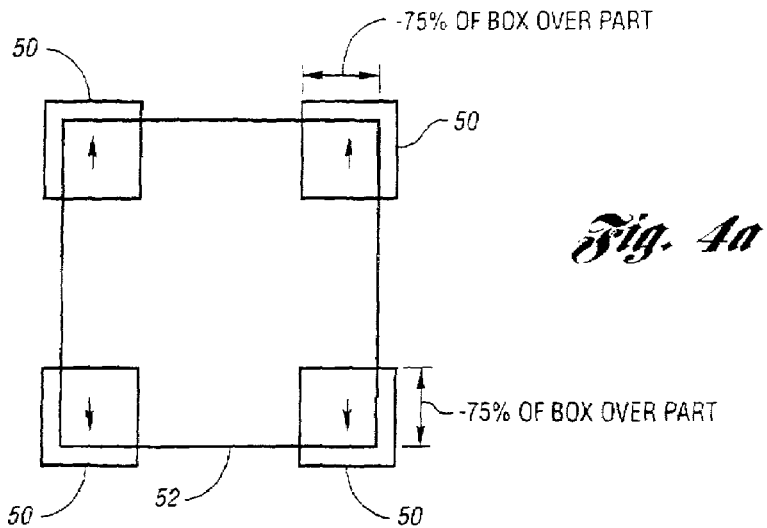
FIG. 4a is a top view of a relatively large square component with search boxes located at its corners.

Referring to FIG. 4a, place a search box 50 on each corner of a 3-D image of a large square component 52 such as a BGA or oscillator. 60–75 percent of box length/height should contain the part; that is, the box 50 should have more part than background in it.

Theta Calculation for the Corner Algorithm

The direction of the template boxes 50 affects how theta is calculated for the device.

Option 1: Use two North and two South or use two East and two West boxes. For objects which are longer vertically, use North and South; for objects which are longer horizontally, use East and West. (For objects which are square, the choice is arbitrary.)

Option 2: Use all one (arbitrary) box direction for all four corners.

Option 1 uses the X/Y shift of the opposing corners to calculate theta, and would generally be more stable/preferred.

Option 2 averages the theta which comes directly from the corner algorithm for each of the corners. This would generally be somewhat less repeatable than option 1.

Figure 4B:
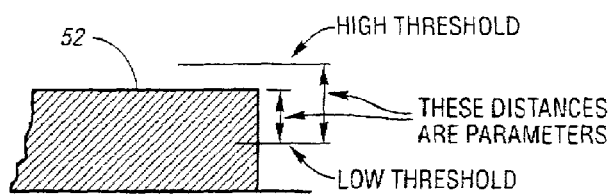

Corner Algorithm Parameters (FIG. 4b)

Offset to Low Threshold

Distance down from part surface to threshold. Generally should be negative. Distance is in mils or mm. Objects below this are not considered.

Offset to High Threshold

Distance above lower threshold (not distance from surface of part).

Objects above this are not considered. In mils or mm. Would generally be positive and slightly larger than the lower threshold distance.

Use Upper Threshold?

0 or 1, this enables/disables use of the upper threshold to discard high objects in the AOI.

Prune Greyscales Below

This is expressed as a pixel value from 0 to 251. 2-D values simply represent the relative brightness of the image data at a particular point. Sometimes a false "glow" appears between parts which are very close together which can fool the 3-D analysis. These pixels often appear darker than the true part being measured. Turning on this feature can allow proper part identification.

Use Greyscale Pruning?

1 or 0 to turn on elimination of pixels which appear dark in the intensity (2-D) image data.

Edge (Not Corner) Mode?

Always leaves this set to 0 for the corner algorithm.

X+Y For Any Box Direction?

Not used when in corner mode. Leave set to 0 for the corner algorithm.

Include Special Values in Blob?

0 or 1. Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary by more than this percentage from the size defined by expected X and Y are reported as missing. A positive integer.

Clear Algorithm Description

Figure 5A:
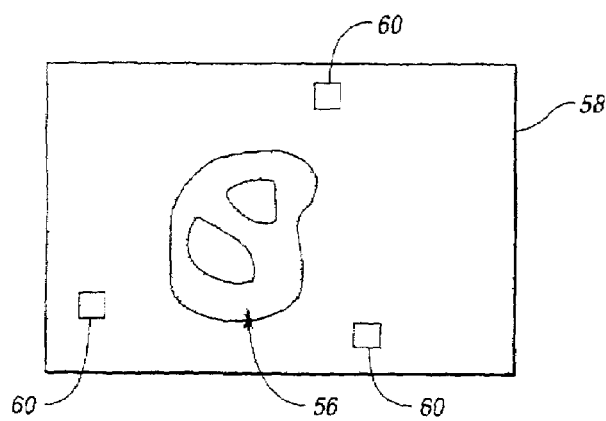
FIG. 5a is a top view of a glue dot or blob of glue on a background.

This algorithm is intended for glue/adhesive or other translucent materials placed on a uniform surface, as illustrated in FIG. 5a. The algorithm can also be used to handle some problems which can arise from use of the simple algorithm on highly "streak" corrupted image data. The simple algorithm isolates the single largest shape in the AOI. The clear algorithm considers all shapes which fall into the Z threshold region defined by its parameters to be part of the object. For a better algorithm to handle special cases which are difficult for the simple algorithm, try using the end cap algorithm, described herein below.

The "train modules" code for this algorithm will correctly set up for small rectangular parts the simple algorithm may have difficulty finding. Setup for this algorithm is generally more difficult than others, and requires more manual setting of algorithm parameters.

The clear parameters are similar to the knee algorithm in that they define a "slice" or "stratum" in the Z data by a distance from the threshold and a "thickness" which defines a region centered about the threshold level.

As illustrated in FIG. 5a, a blob of glue (or glue dot) 56 is positioned on a board 58. A 3-D image is acquired. The background appears uniform. Some regions of the glue appear lower than the background and other regions appear higher. Calboxes 60 are provided for background reference purposes.

Figure 5B:
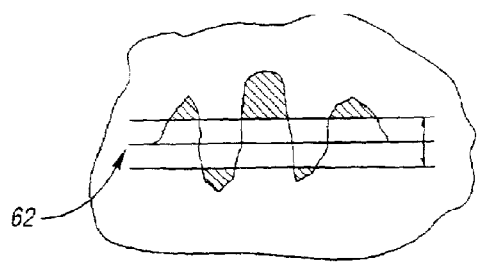

As illustrated in FIG. 5b, a side profile of the glue blob is very irregular. A background level 62 is defined by the calboxes.

Clear Algorithm Parameters

Distance to Threshold Region

Defines the distance from the "Z reference" (either auto-thresh or calboxes in the image). If using "auto" thresh, this would generally be negative—since auto thresh finds the top of the part If using calboxes, this number would usually be positive since calboxes are typically placed on traces at the board surface. This distance is expressed in either mils or mm.

Thickness of Threshold Region

Defines the thickness of the Z slice/stratum which will be considered as part of the object. Expressed in either mils or mm.

Use Auto-Threshold (Not calboxes)?

Set to 1 to use auto-thresh, or 0 to use calboxes. When set to 0, the algorithm will fail unless calboxes are present in the image with the algorithm's boxes. Auto-thresh attempts to find the top of a part contained within the AOI.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flat. Defaults to not include.

Theta From Blob (Not b-box)?

Set to 1 to calculate theta statistically from the blob of pixels.

Set to 0 to calculate theta from the rectangle which most closely bounds the pixels. Theta from blob will not work well for objects which have a fairly square aspect ratio.

Centroid From Blob (Not b-box)?

Set to 1 to calculate the centroid of the blob of pixels directly.

Set to 0 to calculate the centroid as the center of the rectangle which most closely bounds the pixels. Centroid from blob will generally be more repeatable, but centroid from the bounding rectangle may be more accurate on parts with irregular shapes, or which image poorly.

Ignore Blobs Touching Box Edge?

1 or 0. Usually set to 1 which causes all blobs that touch the border of the AOI (the template box) to be ignored. This helps ignore other parts which may encroach on the AOI. The template boxes should be designed bearing in mind that parts which shift enough to touch the boundary will be failed.

Invert Threshold Region?

Set to 1 or 0.

Set to 0 (the default) pixels within the slice or stratum are considered. Set to 1, only pixels outside (above and below) the stratum are considered. This eases set-up for glue, which generally images as areas which are both higher and lower than the surface on which it is placed. The shaded regions of FIG. 5b are outside the threshold slice when set to 1 and are used to determine the blob's size and position.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary (larger or smaller) by more than this percentage from the size defined by expected X and Y are reported as "missing". A positive integer.

The size is checked against the area of the box which most closely encompasses all the shapes which are considered part of the object.

Figure 6A:
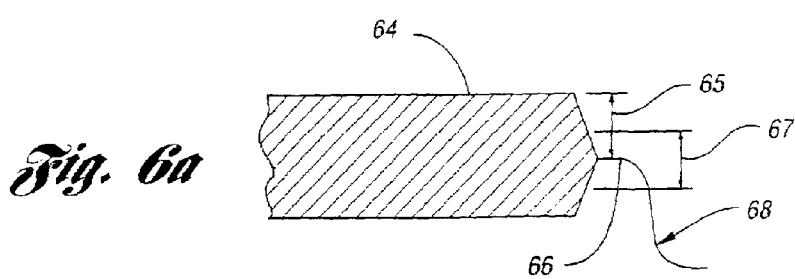
FIG. 6a is a side view, partially broken away, of a component and one of its leads.
Figure 6B:
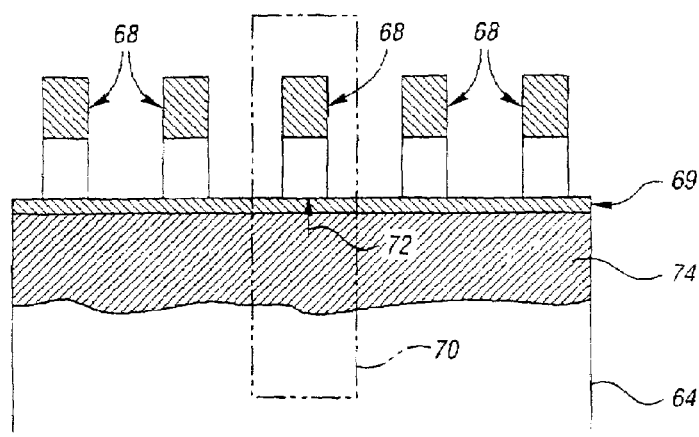
FIG. 6b is a top view, partially broken away and in cross-section, of a component including gull-wing feet with a feature box which includes the part body and one lead.

Knee Algorithm Description (FIGS. 6a and 6b)

This algorithm is used to measure components 64 based on the position of the "knees" 66 of leads 68. Use this algorithm for J-lead parts or for measuring gull-wing parts without the necessity of calibration boxes. The components 64 also include a plastic flash 69 which is often the same height as the knee 66. This algorithm can also be used to measure long rectangular objects such as connectors by setting a single template or feature box 70 on either end of the object 64.

Direction of the measurement boxes 70 is important in the algorithm, since it uses one end of the box 70 to attempt to estimate the height of the part's surface. For proper set-up, a directive arrow 72 of the template box 70 should rest at the "base" of the lead 68, and the feature box 70 should extend past the part's bevel 74.

Auto-learn for this algorithm assumes it is being set up on a leaded part.

Knee Algorithm Parameters

Top of Part to Knee Distance

Distance (height change) 65 from the top of the part 64 to the knee 66. Generally a negative number. Expressed in mils or mm.

Thickness of Threshold Region 67

Defines the thickness of the Z slice/stratum which will be considered as part of the knee 66. Expressed in either mils or mm. A wider setting will allow more variation in parts before failing the algorithm. Too wide and the part's foot may be erroneously detected.

Prune Greyscales Below

This is expressed as a pixel value from 0 to 251. 2-D values simply represent relative brightness of the image data at a particular point. Sometimes a false "glow" appears between leads which can fool the 3-D analysis. These pixels usually appear darker than the true knee pixels. Turning on this feature can allow proper knee identification.

Use Greyscale Pruning?

1 or 0 to turn on/off elimination of pixels which appear dark in the intensity (2-D) image data.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Coplanarity from Calboxes

Set to 1 or 0. A height may be reported for each knee feature. It is normally the distance from the part's surface to the detected knee. If this flag is set, then calboxes must be placed in the image, and the height will be the distance from the plane defined by the calboxes to the surface of the knee. This can give a more meaningful height for use in calculating coplanarity of the part. Note that coplanarity based on knees has little value in detecting damaged leads, since damage often occurs below the knee.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary by more than this percentage from the size defined by expected X and Y are report ed as "missing". A positive integer.

Figure 7A:
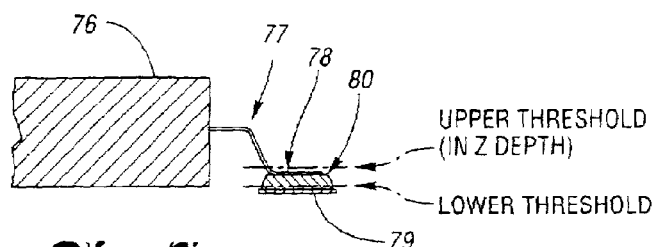
FIG. 7a is a side view, partially broken away and in cross-section, of a component with its foot in solder paste on a solder pad.
Figure 7B:
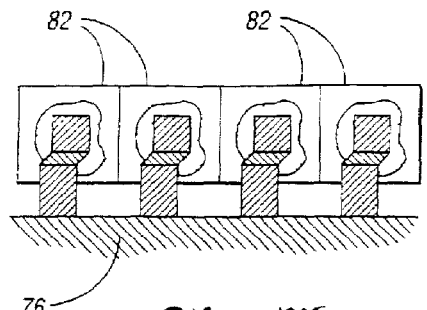
Figure 7C:
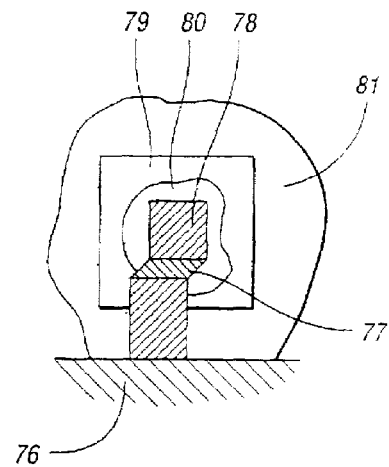
FIG. 7c is an enlarged view of one lead of FIG. 7b.

Foot Algorithm Description (FIGS. 7a, 7b and 7c)

This algorithm is intended to locate/measure gull-wing devices 76 based on the position of their feet 78 in wet paste 80 which are located on pads 79 on a board surface 81. Knees of the leads are indicated by reference numeral 77.

Template boxes 82 set up for this algorithm are similar to those which would be set up for inspection of solder paste.

This algorithm requires calboxes (not shown) placed in the scene with the template boxes 82.

This algorithm calculates an X, Y, and height for each lead foot 78. The heights calculated are based on the plane defined by calboxes in the image, and can be used for coplanarity calculations. In addition, the algorithm produces a percent of border violation which indicates the percent of the AOI's border which has pixels touching it, and can be used to judge the potential for solder-bridging.

Foot Algorithm Parameters

Lower Threshold Height

Distance from the calbox baseplane used to threshold out the board/background. A value of 3 mils should generally work well.

Upper Threshold Height

Objects above this will not be considered. Used to eliminate the lead above the foot and the body of the component from consideration.

At a minimum, this would be set at the expected height of the paste plus the thickness of the lead, plus a small margin. About 15 mils would be an appropriate value for many applications. Expressed in mils or mm.

Prune Greyscales Below

Used to help eliminate "false high" pixels which may come from the fiberglass between pads. The fiberglass is usually much darker than the paste. This is expressed as a pixel value from 0 to 251. 2-D values simply represent the relative brightness of the image data at a particular point.

Lead Greyscale is Above

Used to differentiate the lead foot from the surrounding paste. The foot will appear brighter than the paste. This is a critical value since it determines which pixels will be considered in the final foot X,Y,Z measurements.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary by more than this percentage from the size defined by expected X and Y are reported as "missing". A positive integer.

Polarity Algorithm Description

Algorithm generally used by designating a template box a polarity or non-polarity box. Algorithm rates the variability of a combination of 2-D and 3-D data within the box, and compares to other boxes. This algorithm produces a numerical rating which can be viewed in the teach application, but otherwise produces no result other than a flaw code for parts which fail the test.

For QFPs, place four boxes, one on the polarity dimple, and one on each other corner. For PLCCs, place one box over the edge of the side with the bevel, and one on each of the other side. For parts like tantalum caps, only two boxes are needed since a 90 degree rotation of the part would result in a theta flaw.

The polarity is only checked if the part passes all measurement inspection criteria first. The variability rating of the lowest rated polarity location must be greater than the highest rated non-polarity location. This method allows multiple polarity locations to be designated; for instance, when a part has two cut corners and two which are not.

Polarity Algorithm Parameters

Offset to Low Threshold

Distance down from part surface to threshold. Generally should be negative. Distance is in mils or mm. Objects below this are not considered.

Offset to High Threshold

Distance above lower threshold (not distance above surface of part). Objects above this are not considered. In mils or mm. Would generally be positive and slightly larger than the lower threshold distance.

Use Upper Threshold?

0 or 1, this enables/disables use of the upper threshold to discard high objects in the AOI.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Allow Auto-Shrink (for Notches)?

If looking at a cut corner, or at a notch out of the end of an SO device, this option causes the considered pixels to include pixels which are part of the feature of interest, though not necessarily in the stratum defined by the upper and lower thresholds.

The mechanism is essentially to fit a box around the pixels selected by the upper and lower thresholds, and to look at all the pixels in that box.

Bias Pixels with Greyscale <=

Pixels with 2-D values less than this are biased to increase the variability rating heavily. As an example, the dimple in QFPs often have 2D values under 7, whereas the surrounding part surface may be at 12 or higher. This allows easier identification of these features. 2-D (intensity) values may range from 0–251 in an image.

Use 2-D Only to Calculate Result?

0 or 1, set to 1 when you want to use an intensity feature, such as a silk-screened logo on a part's surface to be judged for variability rather than a 3-D feature which is the default.

Figure 8:
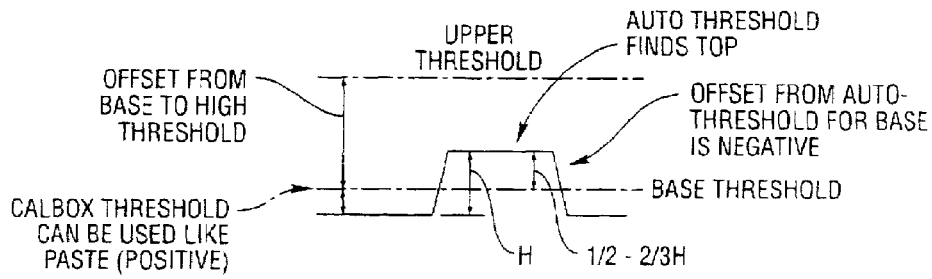
FIG. 8 is a graph of various thresholds for use in a simple algorithm and for a part which does not have leads, or which has leads that image poorly.

Simple Algorithm Description (FIG. 8)

Use on a variety of square/round/odd shaped parts which do not have leads, or which have leads that image very poorly. Particularly suited to chip components. Default parameters are intended for standard chip usage, but allow options for difficult imaging situations or unusual components.

Simple Algorithm Parameters

Offset from Auto-Thresh

Distance down from part surface to threshold. Generally should be negative. Distance is in mils or mm. Objects below this are not considered.

Offset from Calbox Base

Distance up from a plane defined by calboxes in the scene. Generally should be positive. Distance is in mils or mm. Objects below this are not considered.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Theta from Blob (Not b-box)?

Set to 1 to calculate theta statistically from the blob of pixels. Set to 0 to calculate theta from the rectangle which most closely bounds the pixels. Theta from blob will not work well for objects which have a fairly square aspect ratio.

Centroid from Blob (Not b-box)?

Set to 1 to calculate the centroid of the blob of pixels directly. Set to 0 to calculate the centroid as the center of the rectangle which most closely bounds the pixels. Centroid from blob will generally be more repeatable, but centroid from the bounding rectangle may be more accurate on parts with irregular shapes, or which image poorly.

Ignore Blobs Touching Box Edge?

1 or 0. Usually set to 1, which causes all blobs that touch the border of the AOI (the template box) to be ignored. This helps ignore other parts which may encroach on the AOI. The template boxes should be designed bearing in mind that parts which shift enough to touch the boundary will be failed.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary by more than this percentage from the size defined by expected X and Y are reported as "missing". A positive integer.

If the centroid is derived from the blob of pixels, then the size is checked against the area represented by the pixels which are in the threshold stratum. If the centroid is derived from the minimum bounding rectangle, then the size is checked against the area of that rectangle.

Figure 9A:
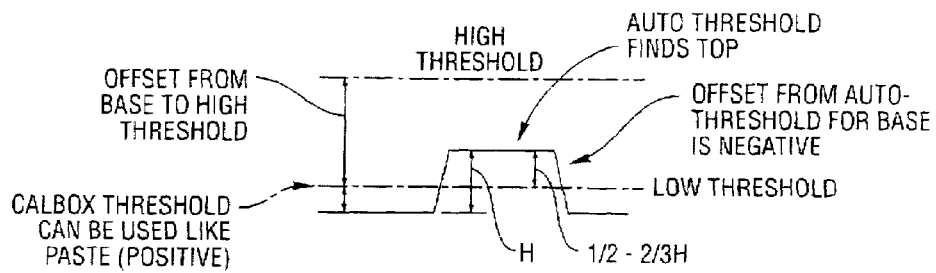
FIG. 9a is a graph similar to FIG. 8 and illustrating an end cap algorithm.
Figure 9B:
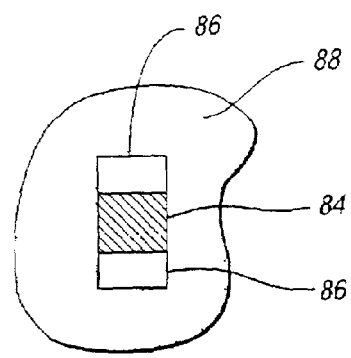
FIG. 9b is a top view, partially broken away, of a component which has end caps positioned on a background.

Endcap Algorithm Description (FIGS. 9a and 9b)

The endcap algorithm is intended primarily for small passive devices 84. The algorithm uses 2-D and 3-D information to isolate and measure only the endcaps 86 of the device 84 on a background 88. This can produce more accurate and robust results than the simple algorithm in some cases. For very small components, such as the device 84 of FIG. 9a, considering endcaps 86 only can produce better results.

The endcap algorithm can also be used for odd-shaped parts which do not appear in the image data as a single unified shape (which is required by the simple algorithm). The endcap algorithm will group all the shapes which fall into the defined 3-D stratum of FIG. 9a, whereas the simple algorithm selects the largest of the shapes in the defined 3-D stratum of FIG. 8.

Endcap Parameters

Offset to Low Threshold

Distance above lower threshold (not distance above surface of part).

Use Upper Threshold?

0 or 1, this enables/disables use of the upper threshold to discard high objects in the AOI.

Endcap Greyscale is Above

Used to differentiate the endcap from the part body and the surrounding paste. The endcap will generally appear brighter than the paste and the component body. This is expressed as a 2-D (brightness) value from 0 to 251. A value of around 60 is a good starting point.

Use Auto-Thresh (Not calboxes)?

Set to 1 to use auto-thresh, or 0 to use calboxes. When set to 0, the algorithm will fail unless calboxes are present in the image with the algorithm's boxes. Auto-thresh attempts to find the top of a part contained within the AOI.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Centroid from Blob (Not b-box)?

Set to 1 to calculate the centroid of the blob of pixels directly. Set to 0 to calculate the centroid as the center of the rectangle which most closely bounds the pixels. Centroid from blob will generally be more repeatable, but centroid from the bounding rectangle may be more accurate on parts with irregular shapes, or which image poorly.

Ignore Blobs Touching Box Edge?

1 or 0. Usually set to 1, which causes all blobs that touch the border of the AOI (the template box) to be ignored. This helps ignore other parts which may encroach on the AOI. The template boxes should be designed bearing in mind that parts which shift enough to touch the boundary will be failed.

Minimum Z Delta

This represents the minimum allowed Z distance from the part's top surface to the background in the inspection box. If the Z range for the box is less than what is specified, then the part will fail with a "missing" condition. This value is set automatically when you train the algorithm. There is a printout of the Z delta when you run the algorithm in teach, which can help determine the best value. This check helps in certain situations where a part is missing, to prevent the paste deposits from being confused with the part endcap; this could result in a false accept. To disable this check entirely, set the value to 0.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary by more than this percentage from the size defined by expected X and Y are reported as "missing". A positive integer.

Figure 10A:
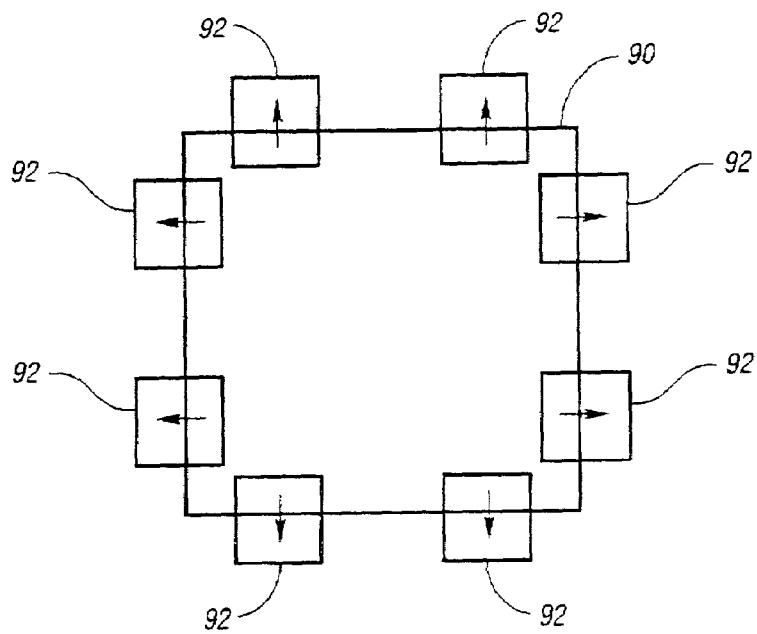
FIG. 10a is a top view of a component with two search boxes located on each side of the component.
Figure 10B:
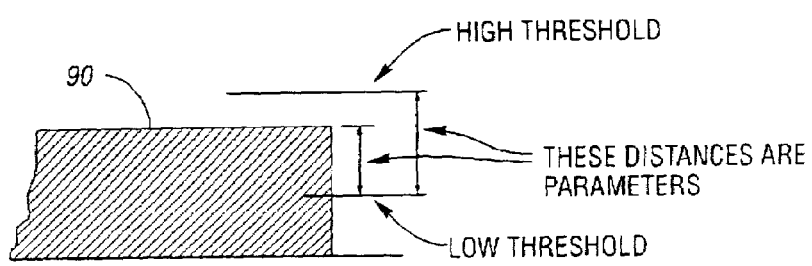

Side Algorithm Description (FIGS. 10a and 10b)

The side algorithm can be applied to find the sides of an object. It would generally be used on square parts 90 which have/don't have corners the corner algorithm can find (they are very irregular or image poorly for some reason). The template should generally have at least two search boxes 92 on each side of the object.

Side Algorithm Parameters

Offset to Low Threshold

Distance down from part surface to threshold. Generally should be negative. Distance is in mils or mm. Objects below this are not considered.

Offset to High Threshold

Distance above lower threshold (not distance above surface of part). Objects above this are not considered. In mils or mm. Would generally be positive and slightly larger than the lower threshold distance.

Use Upper Threshold?

0 or 1, this enables/disables use of the upper threshold to discard high objects in the AOI.

Prune Greyscales Below

This is expressed as a pixel value from 0 to 251. 2-D values simply represent the relative brightness of the image data at a particular point. Sometimes a false "glow" appears between parts which are very close together which can fool the 3-D analysis. These pixels often appear darker than the true part being measured. Turning on this feature can allow proper part identification.

Use Greyscale Pruning?

1 or 0 to turn on elimination of pixels which appear dark in the intensity (2-D) image data.

Edge (Not Corner) Mode?

Always leave this set to 1 for the side algorithm.

X+Y For Any Box Direction?

Set to 0 (the default), each of the boxes stores only an X or Y measurement (an X measurement for E and W boxes, or a Y measurement for N and S boxes). Set to 1, each of the boxes stores both an X and a Y measurement. This can be used in unusual circumstances such as when placing boxes all the way around the perimeter of a round object to find its center.

Include Special Values in Blob?

Special values (white pixels that may arise from mirror-like surfaces or surfaces out-of-range are specially coded with values of 252–255) may be included with the shape within the considered stratum or not. These pixels are not considered at all during normal thresholding, but are included or excluded based solely on this flag. Defaults to not include.

Expected X (Width)

The expected width of the part (relative to a North-oriented template box). Expressed in mils or mm. Generally set when you "train algorithm modules" for the template, or may be set manually.

Expected Y (Length)

The expected length of the part (relative to a North-oriented template box). Expressed in mils or mm. Generally set when you "train algorithm modules" for the template, or may be set manually.

Size Check Percentage

Objects found which vary by more than this percentage from the size defined by expected X and Y are reported as "missing". A positive integer.

While the best mode for carrying out the invention has been described in detail, those familiar with the art to which this invention relates will recognize various alternative designs and embodiments for practicing the invention as defined by the following claims.

Always Auto-Thresh?

0 or 1. 1 always uses the auto-thresh and consequently the "offset from auto-thresh" parameter. 0 uses the calbox baseplane when calboxes are available in the image and consequently the "offset from calbox base" parameter.

Offset to High Threshold

Distance above lower threshold (not distance above surface of part). Objects above this are not considered. In mils or mm. Would generally be positive and slightly larger than the lower threshold distance.

Threshold High Objects?

0 or 1. this enables/disables use of the upper threshold to discard high objects in the AOI.

Prune Greyscales Below

This is expressed as a pixel value from 0 to 251. 2-D values simply represent the relative brightness of the image data at a particular point. Sometimes a false "glow" appears between parts which are very close together which can fool the 3-D analysis. These pixels often appear darker than the true part being measured. Turning on this feature can allow proper part identification.

Use Greyscale Pruning?

1 or 0 to turn on elimination of pixels which appear dark in the intensity (2-D) image data.

What is claimed is:

1. A method for inspecting electronic components mounted on a printed circuit board with a mounting substance, each of the components including electrical interconnects to the circuit board as typified by leads or endcaps, the method comprising:

imaging the components and the mounting substance on the printed circuit board to obtain 3-D and 2-D data associated with the components and material surrounding the components; and processing the 3-D and 2-D data in combination to form blob and edge images wherein the step of processing includes evaluating the blob and edge images to find the locations of the components as a function of the 3-D and 2-D data and based on identified leads, endcaps, or other component features as differentiated from the mounting substance and circuit board on which the components are placed and wherein the step of processing further includes the step of applying thresholding techniques and a connected component algorithm to the 3-D and 2-D data in combination to form the blob and edge images.

2. The method as claimed in claim 1, wherein the mounting substance is solder paste.

3. The method as claimed in claim 1, wherein the mounting substance is an adhesive.

4. The method as claimed in claim 3, wherein the adhesive is a glue.

5. The method as claimed in claim 1, wherein the leads have feet and wherein the step of processing includes the step of calculating centroids of the feet.

6. The method as claimed in claim 1, wherein the leads have feet and wherein the step of processing includes the step of calculating average height of the feet.

7. The method as claimed in claim 1, wherein the step of processing includes calculating a percentage of pixels classified as the mounting substance that are at an area of interest border to determine a potential for bridging between adjacent solder deposits, and the percentage of pixels comprises a border violation percentage.

8. The method as claimed in claim 1, wherein the step of processing includes the step of processing the 3-D data together with upper and lower threshold values to find the location of the leads and the mounting substance.

9. The method of claim 1, wherein the step of processing comprises masking at least one of the 2-D and 3-D data with the blob image.

10. The method of claim 1, wherein the step of processing includes the step of applying at least one threshold to the at least one of the 2-D and 3-D data.

11. The method of claim 1 further comprising detecting an edge of the blob image and applying a bounding rectangle to the edge.

12. The method of claim 11, wherein the bounding rectangle is a minimum area rectangle, and wherein the bounding rectangle is used to determine component position and orientation.

13. The method of claim 1, wherein the step of processing comprises comparing at least one of a predetermined three-dimensional size and shape of a component with 3-D data representative of the component so as to verify component presence.

14. The method of claim 1, wherein the step of processing comprises comparing at least one of a predetermined three-dimensional size and shape of an attribute of the component with 3-D data representative of the attribute to verify component presence.

15. A system for inspecting electronic components mounted on a printed circuit board with a mounting substance, each of the components including electrical interconnects to the circuit board as typified by leads or endcaps, the system comprising:

a 3-D scanner for imaging the components and mounting substance on the printed circuit board to obtain 3-D and 2-D data associated with the components and material surrounding the components; and a high-speed image processor for processing the 3-D and 2-D data in combination to form blob and edge images wherein the image processor also evaluates the blob and edge images to find the locations of the components as a function of the 3-D and 2-D data and based on identified leads, endcaps, or other component features as differentiated from the mounting substance and circuit board on which the components are placed and wherein the image processor also applies thresholding techniques and a connected component algorithm to the 3-D and 2-D data in combination to form the blob and edge images.

16. The system as claimed in claim 15, wherein the mounting substance is solder paste.

17. The system as claimed in claim 15, wherein the mounting substance is an adhesive.

18. The system as claimed in claim 17, wherein the adhesive is a glue.

19. The system as claimed in claim 15, wherein the leads have feet and wherein the image processor also calculates centroids of the feet.

20. The system as claimed in claim 15, wherein the leads have feet and wherein the image processor also calculates average height of the feet.

21. The system as claimed in claim 15, wherein the image processor also calculates a percentage of pixels classified as mounting substance that are at an area of interest border to determine a potential for bridging between adjacent solder deposits, and the percentage of pixels comprises a border violation percentage.

22. The system as claimed in claim 15, wherein the image processor also masks at least one of the 2-D and 3-D data with the blob image.

23. The system as claimed in claim 15, wherein the image processor processes the 3-D data with upper and lower threshold values to find the locations of the leads and the mounting substance.

* * * * *